United States Patent
Niimi et al.

(10) Patent No.: US 9,111,911 B2
(45) Date of Patent: Aug. 18, 2015

(54) HEAT SINK, AND HEAT SINK-EQUIPPED ELECTRONIC COMPONENT PART

(75) Inventors: Yoshikazu Niimi, Miyoshi (JP); Masatsugu Takarabe, Owariashi (JP); Masaya Kaji, Toyota (JP); Takanori Kawashima, Anjo (JP)

(73) Assignee: TOYOTA JIDOSHA KABUSHIKI KAISHA, Toyota-Shi (JP)

(*) Notice: Subject to any disclaimer, the term of this patent is extended or adjusted under 35 U.S.C. 154(b) by 167 days.

(21) Appl. No.: 13/434,742

(22) Filed: Mar. 29, 2012

(65) Prior Publication Data
US 2012/0247743 A1    Oct. 4, 2012

(30) Foreign Application Priority Data
Apr. 1, 2011    (JP) .................................. 2011-081814

(51) Int. Cl.
| F28F 7/00 | (2006.01) |
| F28D 15/00 | (2006.01) |
| H01L 23/473 | (2006.01) |
| H05K 7/20 | (2006.01) |
| F28D 21/00 | (2006.01) |

(52) U.S. Cl.
CPC ...... H01L 23/473 (2013.01); *F28D 2021/0029* (2013.01); *H01L 2924/0002* (2013.01); *H05K 7/20254* (2013.01)

(58) Field of Classification Search
USPC ............ 165/80.4, 170, 181, 183, 168, 104.19
See application file for complete search history.

(56) References Cited

U.S. PATENT DOCUMENTS

| 5,079,619 A * | 1/1992 | Davidson .................... 257/714 |
| 5,239,200 A * | 8/1993 | Messina et al. ............... 257/714 |
| 5,705,850 A | 1/1998 | Ashiwake et al. |
| 5,947,365 A * | 9/1999 | Tanaka et al. .................. 228/136 |
| 5,988,266 A * | 11/1999 | Smith et al. ..................... 165/78 |
| 6,050,332 A * | 4/2000 | Smith et al. .................... 165/185 |
| 6,651,735 B2 * | 11/2003 | Cho et al. ................. 165/104.26 |
| 2004/0184237 A1 | 9/2004 | Chang |
| 2006/0096742 A1 * | 5/2006 | Bhatti et al. ............. 165/104.33 |
| 2006/0231236 A1 * | 10/2006 | Spokoiny et al. ............ 165/80.4 |
| 2007/0029665 A1 * | 2/2007 | Lee et al. ....................... 257/712 |
| 2008/0023189 A1 * | 1/2008 | Kimura et al. ................ 165/185 |
| 2008/0029251 A1 | 2/2008 | Nakajima et al. |
| 2008/0047694 A1 * | 2/2008 | Delano et al. ............ 165/104.33 |
| 2008/0314559 A1 * | 12/2008 | Hsu et al. ..................... 165/80.4 |
| 2011/0067841 A1 * | 3/2011 | Doo et al. ................ 165/104.19 |

FOREIGN PATENT DOCUMENTS

| CN | 101119625 A | 2/2008 |
| EP | 1744360 A2 | 1/2007 |
| JP | 2008-098432 A | 3/1995 |
| JP | 2006-100293 A | 4/2006 |
| JP | 2007-110025 A | 4/2007 |
| JP | 4027353 B2 | 10/2007 |
| JP | 07-086471 A | 4/2008 |
| JP | 4403867 B2 | 11/2009 |

* cited by examiner

*Primary Examiner* — Allen Flanigan
*Assistant Examiner* — Jason Thompson
(74) *Attorney, Agent, or Firm* — Kenyon & Kenyon LLP

(57) ABSTRACT

A heat sink includes a flow path through which a cooling medium that cools a heat-producing body flows, the flow path having two flow path wall surfaces that face each other; and a plurality of columnar fins provided on one of the flow path wall surfaces, which is positioned at a side where the heat-producing body is provided, the plurality of columnar fins including a long columnar fin and a short columnar fin, and the other of the flow path wall surfaces having a recess in which a distal end portion of the long columnar fin is inserted.

9 Claims, 5 Drawing Sheets

FIG. 10

HEAT SINK, AND HEAT SINK-EQUIPPED ELECTRONIC COMPONENT PART

INCORPORATION BY REFERENCE

The disclosure of Japanese Patent Application No. 2011-081814 filed on Apr. 1, 2011 including the specification, drawings and abstract is incorporated herein by reference in its entirety.

BACKGROUND OF THE INVENTION

1. Field of the Invention

The invention relates to a heat sink and to a heat sink-equipped electronic component part.

2. Description of Related Art

Electronic component parts (e.g., a power module) constructed of semiconductor elements and the like are mounted in a vehicle such as a motor vehicle or the like. An electronic component part produces heat when in operation, and is therefore thermally connected to a heat sink.

A heat sink has a flow path that conveys a cooling medium that cools an electronic component part that is a heat-producing body. The flow path has two flow path wall surfaces that face each other. Of the two flow path wall surfaces, a flow path wall surface (cooling surface) at a side where the electronic component part is attached is provided with a plurality of fins.

A clearance for preventing interference during assembly of the heat sink is formed between distal ends of the plurality of fins and the flow path wall surface that faces the cooling surface (i.e., the opposite surface). Since this clearance has no obstacle that impedes the flow of the cooling medium, the cooling medium easily flows through the clearance. Therefore, since the cooling medium easily flows in the vicinity of the opposite surface, and less easily flows in the vicinity of the cooling surface, the cooling performance is not very good.

Hence, there is proposed a heat sink in which the opposite surface is provided with a plurality of protrusions in the shape of waves in order to impede the flow of the cooling medium in the vicinity of the opposite surface (see, e.g., Japanese Patent Application Publication No. 2007-110025 (JP-A-2007-110025)). These wavy protrusions are provided so that the summit of each protrusion is positioned between the distal ends of fins.

Another heat sink in which protrusions whose vertical sectional shape is triangular are arranged so as to meander (or zigzag) for another purpose has been proposed (see, e.g., Japanese Patent No. 4027353). The protrusions are provided for three-dimensionally stirring the flow of the cooling medium and causing the cooling medium to strike the cooling surface. The protrusions, according to, for example, Japanese Patent No. 4027353, may be provided on both the cooling surface and the opposite surface. In this case, the heat transfer area of the heat sink, which transfers heat to the cooling medium, increases, and the narrowed flow paths cause the cooling medium to flow faster.

However, in the heat sink described in Japanese Patent Application Publication No. 2007-110025 (JP-A-2007-110025), since there is no obstacle that impedes the flow of the cooling medium in recesses that are trough portions of the wavy protrusions provided on the opposite surface, the cooling medium easily flows in the recesses. Therefore, in the vicinity of the opposite surface, the effect of impeding the flow of the cooling medium is not sufficient, and therefore the cooling performance is not sufficient.

Besides, the heat sink described in Japanese Patent No. 4027353 has the following problems (1) to (2). (1) Since the cooling surface has no protrusion, or if any, the vertical sectional shape thereof is triangular, the heat transfer area of the heat sink, which transfers heat to the cooling medium, is small. (2) In the case where protrusions are formed on both the cooling surface and the opposite surface so as to narrow the flow path, the amount of change in the flow rate with respect to the dimensional error of the flow path is large, and therefore the variation in the cooling performance and the variation in the pressure loss are large.

SUMMARY OF THE INVENTION

The invention provides a heat sink that is excellent in cooling performance.

A heat sink according to one aspect of the invention includes a flow path through which a cooling medium that cools a heat-producing body flows, the flow path having two flow path wall surfaces that face each other; and a plurality of columnar fins provided on one of the flow path wall surfaces, which is positioned at a side where the heat-producing body is provided, the plurality of columnar fins including a long columnar fin and a short columnar fin, and the other of the flow path wall surfaces having a recess in which a distal end portion of the long columnar fin is inserted.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Hereinafter, embodiments of the invention will be described with reference to the accompanying drawings. The same or corresponding portions are denoted by the same or corresponding reference numbers or characters in the drawings, and will not be redundantly described below.

First Embodiment

Figure 1:
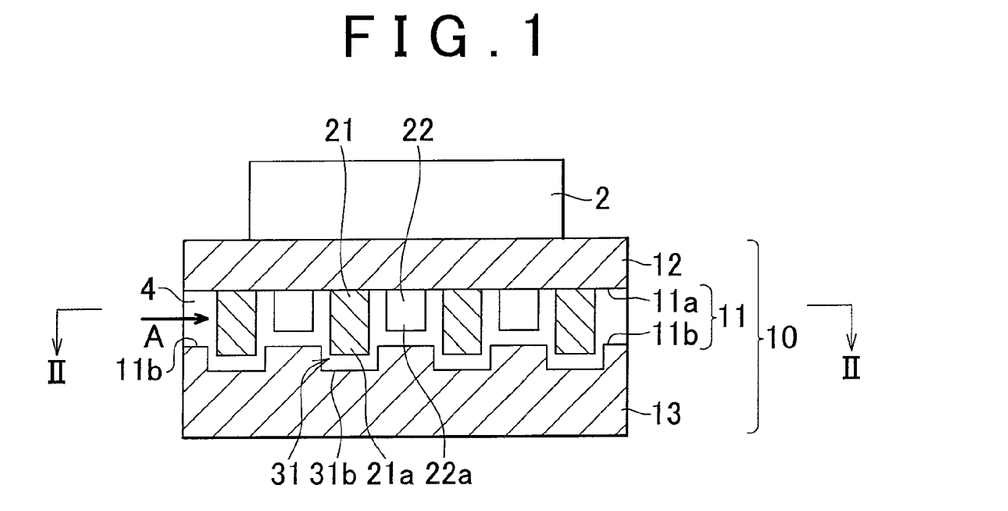
FIG. 1 is a sectional view taken along line I-I in FIG. 2, showing a heat sink-equipped electronic component part according to a first embodiment of the invention.
Figure 2:
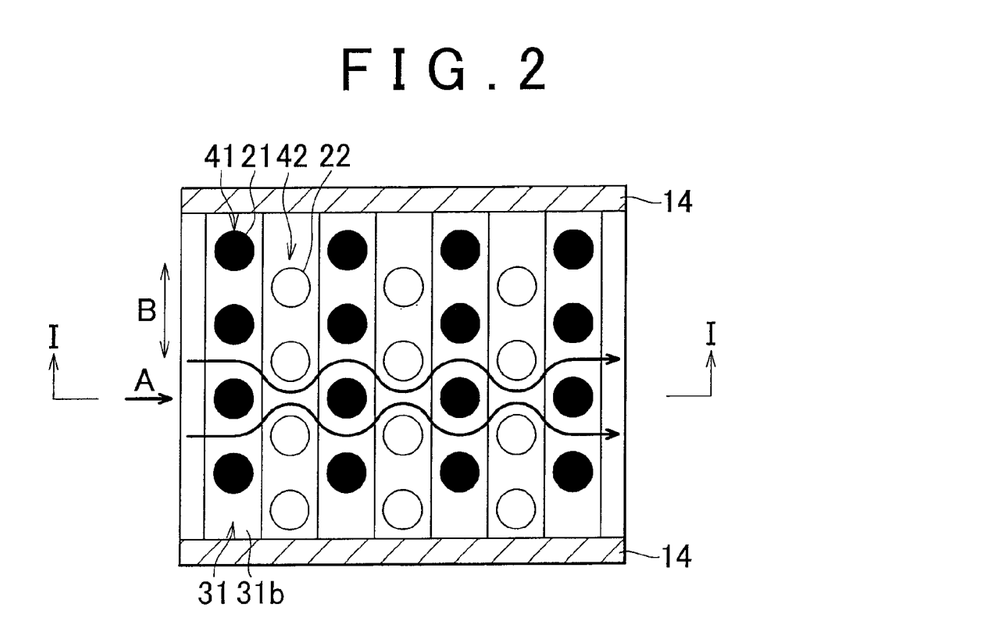
FIG. 2 is a sectional view taken along line II-II in FIG. 1.

FIG. 1 is a sectional view taken along line I-I in FIG. 2, showing a heat sink-equipped electronic component part according to a first embodiment of the invention. FIG. 2 is a sectional view taken along line II-II in FIG. 1. In FIG. 2, for better illustration, the long columnar fins are shown by black circles, and short columnar fins are shown by white circles.

The heat sink 10 has in its inside a flow path 11 in which a cooling medium 4 flows. The cooling medium 4 cools an electronic component part 2 that is a heat-producing body. The electronic component part 2 includes semiconductor elements and the like, and produces heat when in operation. Concrete examples of the electronic component part 2 include a power module that has a semiconductor element for converting electric power, such as an IGBT. The heat sink 10 of this embodiment is also usable for cooling heat-producing bodies other than the electronic component part 2.

The cooling medium 4 moves through the flow path 11 to the outside, thereby releasing heat from the heat sink 10 and therefore heat from the electronic component part 2 to the outside. After moving to the outside, the cooling medium 4 may be cooled by a cooler, and then may be refluxed to the flow path 11. The cooling medium 4 used herein is a liquid, such as water or an antifreeze, or a gas such as air.

The heat sink 10 is formed of, for example, a resin, a metal, or a ceramic material. The resin is excellent in formability (or moldability) and is light in weight. The metal is excellent in heat conductivity. The ceramic material is excellent in heat resistance.

The heat sink 10 includes a heat radiating plate 12 to which the electronic component part 2 is attached, an opposite plate 13 that faces (is opposite to) the heat radiating plate 12, and side walls 14 (see FIG. 2) provided between the heat radiating plate 12 and the opposite plate 13. The heat radiating plate 12, the opposite plate 13 and the side walls 14 are integrally provided as one body. One electronic component part 2 is attached to the heat radiating plate 12 in FIG. 1, but two or more electronic component parts 2 may be attached to the heat radiating plate 12. Besides, the heat radiating plate 12 and the electronic component part 2 may be integrally molded.

The heat radiating plate 12, the opposite plate 13 and the side walls 14 may be manufactured separately and then may be coupled together. Furthermore, the heat radiating plate 12 and the side walls 14 may be integrally molded, and the opposite plate 13 may be coupled to the integrally molded body. Furthermore, the opposite plate 13 and the side walls 14 may be integrally molded, and the heat radiating plate 12 may be coupled to the integrally molded body. Examples of the coupling method include a coupling method that uses bolts, a coupling method that employs swaging, etc. The coupling sites may be provided with a seal member for preventing leak of the cooling medium 4. The seal member used herein may be, for example, a rubber or metal member, a solid gasket, a viscous gasket, or an O-ring.

The heat radiating plate 12, the opposite plate 13 and the side walls 14 surround the flow path 11. The flow path 11 has two flow path wall surfaces 11a and 11b that face each other. Of the two flow path wall surfaces 11a and 11b, the flow path wall surface (cooling surface) 11a at a side where the electronic component part 2 is installed (i.e., a side where the electronic component part 2 is provided) is constituted by an inside surface of the heat radiating plate 12. Besides, the flow path wall surface (opposite surface) 11b that faces the cooling surface 11a is constituted by an inside surface of the opposite plate 13.

The cooling surface 11a is provided with a plurality of columnar fins 21 and 22 for increasing the heat transfer area of the heat sink 10, which transfers heat to the cooling medium 4, thereby enhancing the cooling performance of the heat sink 10.

The columnar fins 21 and 22 may be molded integrally with the heat radiating plate 12, or may be manufactured separately from the heat radiating plate 12 and then be coupled to the heat radiating plate 12. Each of the columnar fins 21 and 22, if molded integrally with the heat radiating plate 12, may have a taper shape that narrows toward the distal end thereof, so that the molded product easily separates from a molding die.

A cross-sectional shape of the columnar fins 21 and 22 is, for example, a circular shape as shown in FIG. 2.

Since the columnar fins 21 and 22 are simple in shape, the columnar fins 21 and 22 are good in formability or moldability in comparison with the case where protrusions whose vertical sectional shape is triangular are arranged so as to meander (or zigzag) as in the related art. In addition, since the columnar fins 21 and 22 are simple in shape, the columnar fins 21 and 22 can easily be changed in design, such as dimensions, shape, pitch, etc. in comparison with the related art.

The plurality of columnar fins 21 and 22 include long columnar fins 21, and short columnar fins 22 that are shorter in length than the long columnar fins 21. The long columnar fins 21 and the short columnar fins 22 may be formed of the same material, or may be formed of different materials.

Distal end portions 21a of the long columnar fins 21 are inserted in recesses 31 that are formed in the opposite surface 11b. Between the distal end portions 21a of the long columnar fins 21 and inside bottom surfaces 31b of the recesses 31, there are clearances for preventing interference at the time of assembling the heat sink.

On the other hand, distal end portions 22a of the short columnar fins 22 are disposed facing the opposite surface 11b. Between the distal end portions 22a of the short columnar fins 22 and the opposite surface 11b, there are clearances for preventing interference at the time of assembling the heat sink.

In this embodiment, since the distal end portions 21a of the long columnar fins 21 are inserted in the recesses 31 that are formed in the opposite surface 11b, the flow resistance is large and the cooling medium 4 does not easily flow in the recesses 31. Therefore, the cooling medium 4 does not easily flow in the vicinity of the opposite surface 11b and flows easily in the vicinity of the cooling surface 11a, so that the cooling performance of the heat radiating plate 12 improves.

Besides, in the embodiment, since the cooling medium 4 does not easily flow in the vicinity of the opposite surface 11b, the flow of the cooling medium 4 can be dispersed between the opposite surface 11b and the cooling surface 11a, so as to reduce the variation in the cooling performance and the variation in the pressure loss relative to the variation in the clearance for preventing interference. Besides, since the flow of the cooling medium 4 can be dispersed, the maximum pressure loss can be reduced.

Furthermore, in this embodiment, since the short columnar fins 22 are provided to face the opposite surface 11b, the heat transfer area of the heat sink 10, which transfers heat to the cooling medium 4, increases, and therefore the cooling performance improves.

As shown in FIG. 2, the long columnar fins 21 are arranged on the cooling surface 11a at intervals in a direction (direction of arrows B in FIG. 2) orthogonal to the direction of the mainstream of the cooling medium 4 (the direction of an arrow A in FIG. 2) so as to form rows 41 of the long columnar fins 21 (long columnar fin rows 41), which extend in the direction of the arrows B. The plurality of long columnar fin rows 41 are arranged at intervals in the direction of the arrow A.

Likewise, the short columnar fins 22 are arranged on the cooling surface 11a at intervals in the direction of the arrows B so as to form rows 42 of the short columnar fins 22 (short columnar fin rows 42), which extend in the direction of the arrows B. The plurality of short columnar fin rows 42 are arranged at intervals in the direction of the arrow A.

The long columnar fin rows 41 and the short columnar fin rows 42 are alternately arranged in the direction of the arrow A. Besides, when seen in the direction of the arrow A, each of the long columnar fins 21 does not overlap any one of the short columnar fins 22.

In this manner, the columnar fins 21 and 22 are arranged in a staggered manner on the cooling surface 11a. Hence, the cooling medium 4 flows around peripheries of the columnar fins 21 and 22 as shown in FIG. 2, so that the heat transfer performance around the columnar fins 21 and 22 is good.

Besides, since the long columnar fins 21 are arranged at intervals in the direction (direction of the arrows B) that intersects with the direction of the mainstream of the cooling medium 4 (the direction of the arrow A), the flow of the cooling medium 4 in the vicinity of the opposite surface 11b can be impeded at a plurality of locations in the direction of the width of the flow.

As shown in FIG. 2, the recesses 31 formed in the opposite surface 11b extend in the direction of the arrows B, and each recess 31 embraces the distal end portions 21a of all the long columnar fins 21 of a corresponding one of the long columnar fin rows 41. That is, the distal end portion 21a of each of the long columnar fins 21 of one long columnar fin row 41 is inserted in each of the recesses 31. Hence, the tolerable range of the variation in the pitch between the long columnar fins 21 in each long columnar fin row 41 is increased, and the ease of assembly of the heat sink 10 improves.

Figure 3:
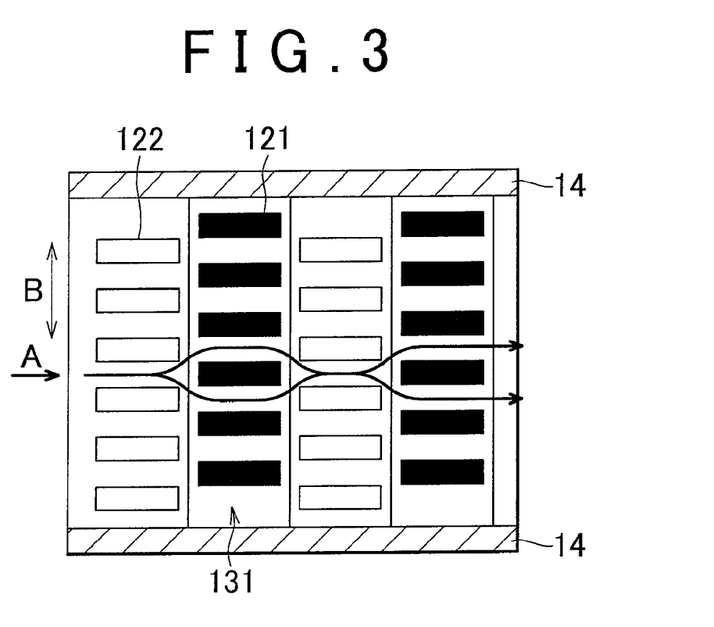
FIG. 3 is a sectional view of a modification of what is shown in FIG. 2.

Although in the embodiment, the long columnar fins 21 and the short columnar fins 22 have a circular cross-sectional shape, their cross-sectional shape may be a polygon, such as a triangle or a quadrangle, or may be an ellipse. That is, the cross-sectional shape of the columnar fins 21 and 22 is not particularly limited. For example, as in the case of long columnar fins 121 and short columnar fins 122 shown in FIG. 3, the cross-sectional shape of the columnar fins may be a rectangle that is elongated in the direction of the mainstream of the cooling medium 4 (the direction of the arrow A). The width of the recesses 131 is set according to the shape of the long columnar fins 121.

Second Embodiment

In the foregoing first embodiment, the long columnar fin rows 41 and the short columnar fin rows 42 are alternately arranged in the direction of the mainstream of the cooling medium 4 (the direction of the arrow A) so that the long and short columnar fins 21 and 22 are arranged in the staggered manner.

In the second embodiment, on another hand, row groups that are each made up of two short columnar fin rows and row groups that are each made up of one long columnar fin row are alternately arranged in the direction of the arrow A.

Figure 4:
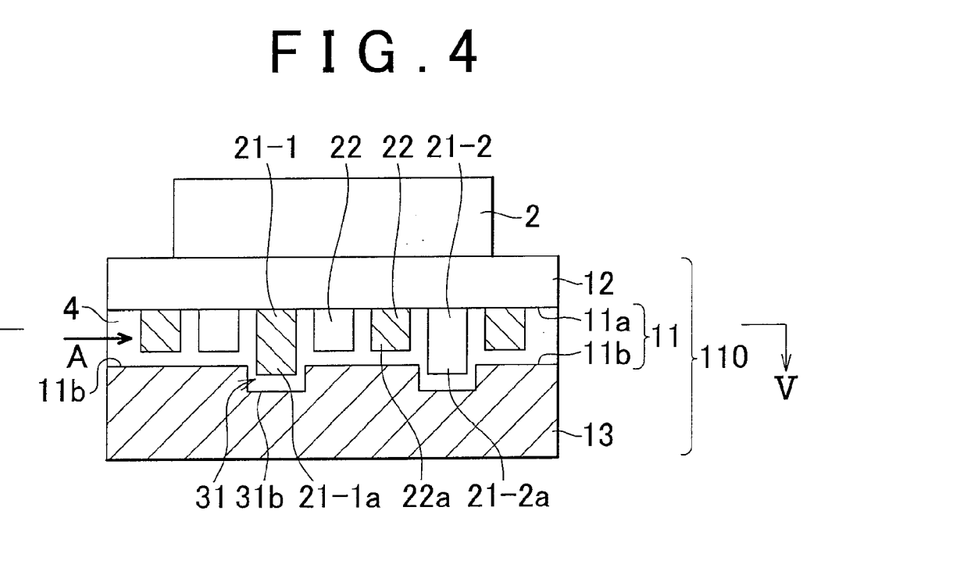
FIG. 4 is a sectional view taken along line IV-IV in FIG. 5, showing a heat sink-equipped electronic component part according to a second embodiment of the invention.
Figure 5:
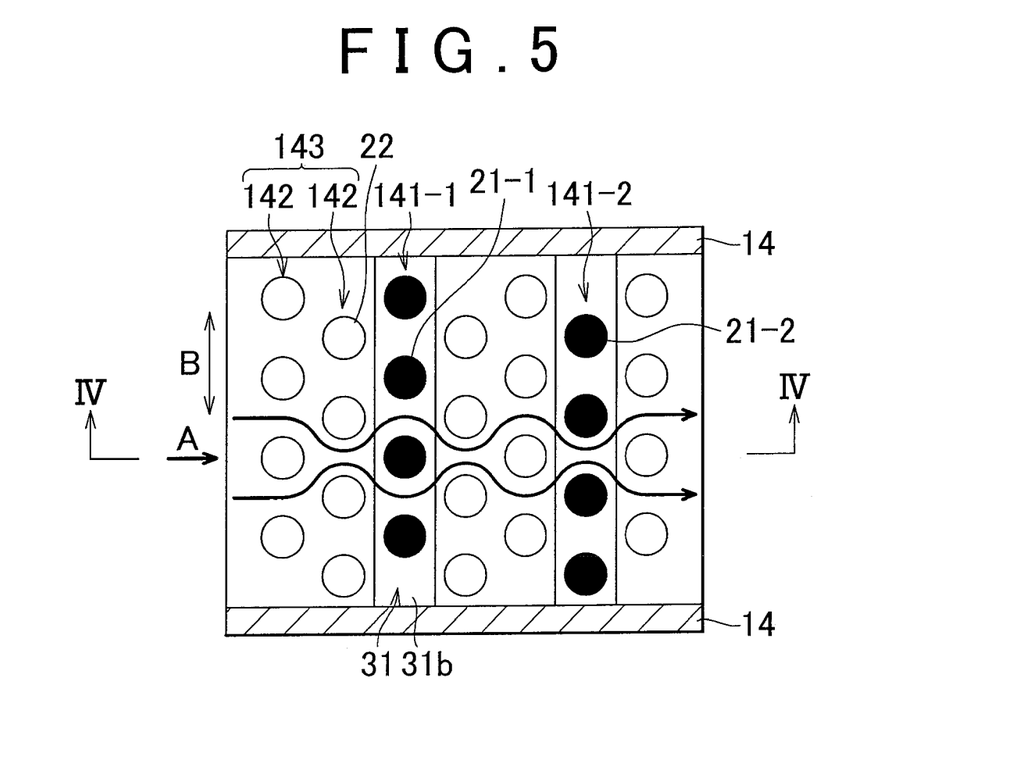
FIG. 5 is a sectional view taken along line V-V in FIG. 4.
Figure 6:
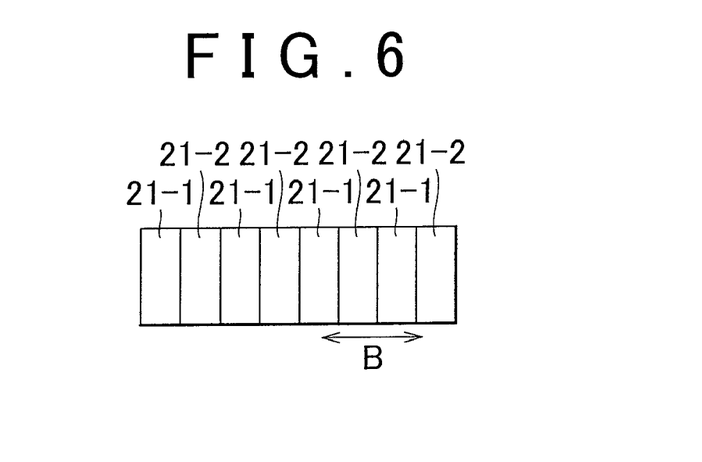
FIG. 6 is a diagram showing a positional relation among long columnar fins of two long columnar fin rows when seen in a direction of a mainstream of a cooling medium.

With reference to FIG. 4 to FIG. 6, the configuration of a heat sink in accordance with the second embodiment will be described. However, the configuration thereof other than the arrangement of columnar fins is substantially the same as the configuration in the first embodiment, and therefore will not be described below.

FIG. 4 is a sectional view taken along line IV-IV in FIG. 5, showing a heat sink-equipped electronic component part according to the second embodiment. FIG. 5 is a sectional view taken along line V-V in FIG. 4. In FIG. 5, for better illustration, the long columnar fins are shown by black circles, and the short columnar fins are shown by white circles. FIG. 6 is a diagram showing a positional relationship among the long columnar fins of two long columnar fin rows when seen in the direction of the mainstream of the cooling medium.

A heat sink 110 in the second embodiment includes long columnar fins 21-1 and 21-2 and short columnar fins 22, as in the first embodiment.

The long columnar fins 21-1 and 21-2 are arranged on the cooling surface 11a at intervals in the direction (the direction of the arrows B in FIG. 5) orthogonal to the direction of the mainstream of the cooling medium 4 (the direction of the arrow A in FIG. 5) so as to form long columnar fin rows 141-1 and 141-2 that extend in the direction of the arrows B (see FIG. 5).

Likewise, the short columnar fins 22 are arranged on the cooling surface 11a at intervals in the direction of the arrows B orthogonal to the direction of the arrow A so as to form short columnar fin rows 142 that extend in the direction of the arrows B (see FIG. 5).

In the second embodiment, row groups that are each made up of one long columnar fin row 141-1 (or 141-2) and row groups 143 that are each made up of two short columnar fin rows 142 are alternately arranged in the direction of the arrow A on the cooling surface 11a so that the long and short columnar fins 21-1 and 21-2 and 22 are arranged in the staggered manner.

Therefore, as shown in FIG. 6, when seen in the direction of the arrow A, each of the long columnar fins 21-2 of the long columnar fin row 141-2 is disposed at such a position that at least a portion of the long columnar fin 21-2 does not overlap any one of the long columnar fins 21-1 of the long columnar fin row 141-1 nearest to the long columnar fin row 141-2.

As a result, the cooling medium 4 flowing in the vicinity of the opposite surface 11b flows through spaces between the long columnar fins 21-1 of the long columnar fin row 141-1, and then strikes the long columnar fins 21-2 of the next long columnar fin row 141-2. Hence, the flow of the cooling medium 4 in the vicinity of the opposite surface 11b can be impeded equally over the entire width of the flow.

Third Embodiment

In the first embodiment, the long columnar fin rows 41 and the short columnar fin rows 42 are alternately arranged in the direction of the mainstream of the cooling medium 4 (the direction of the arrow A) so that the long and short columnar fins 21 and 22 are arranged in the staggered manner.

In the third embodiment, on another hand, row groups that are each made up of two long columnar fin rows and row groups that are each made up of one short columnar fin row are alternately arranged in the direction of the arrow A so that the columnar fins are arranged in the staggered manner.

Hereinafter, the configuration of a heat sink in accordance with the third embodiment will be described with reference to FIGS. 7 and 8. However, the configuration other than recesses and an arrangement of the columnar fins 21 and 22 is substantially the same as the configuration in the first embodiment, and therefore will not be described.

Figure 7:
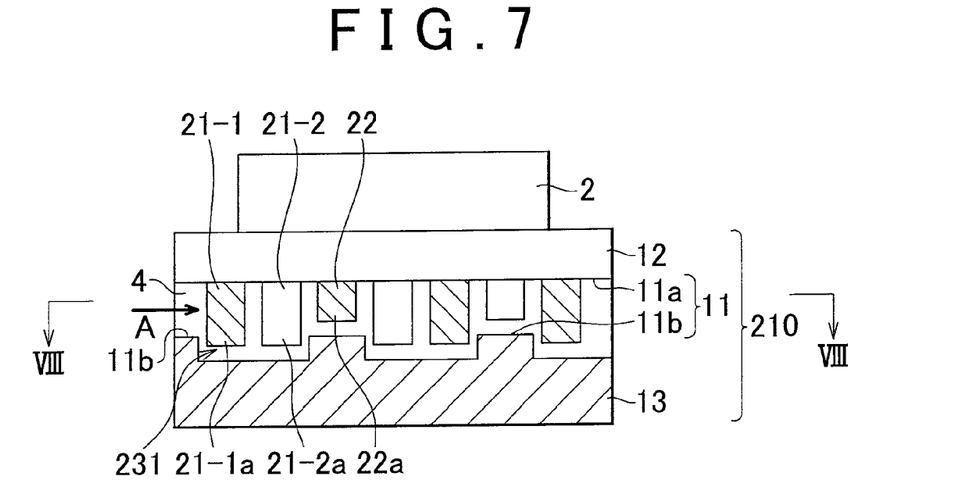
FIG. 7 is a sectional view taken along line VII-VII in FIG. 8, showing a heat sink-equipped electronic component part according to a third embodiment of the invention.
Figure 8:
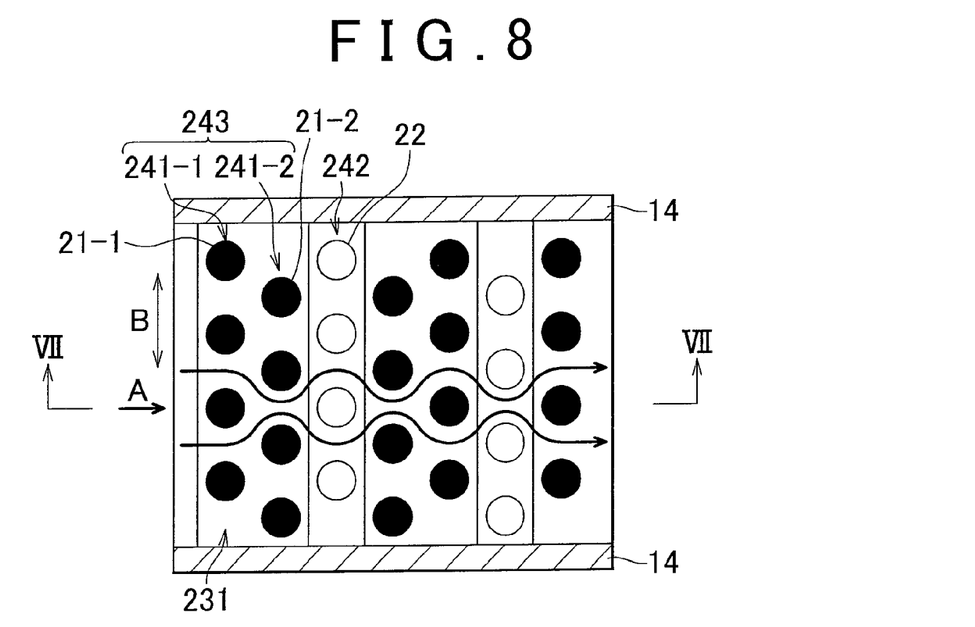
FIG. 8 is a sectional view taken along line VIII-VIII in FIG. 7.

FIG. 7 is a sectional view taken along line VII-VII in FIG. 8, showing a heat sink-equipped electronic component part according to the third embodiment. FIG. 8 is a sectional view taken along line VIII-VIII in FIG. 7. In FIG. 8, for better illustration, long columnar fins are shown by black circles, and short columnar fins are shown by white circles. The positional relationship among the long columnar fins of two long columnar fin rows in a view in the direction of the mainstream of the cooling medium is substantially the same as that shown in FIG. 6, and therefore is not shown in a drawing.

A heat sink 210 in the third embodiment includes long columnar fins 21-1 and 21-2 and short columnar fins 22 as in the first embodiment.

The long columnar fins 21-1 and 21-2 are arranged on the cooling surface 11a at intervals in the direction (the direction of the arrows B in FIG. 8) orthogonal to the direction of the mainstream of the cooling medium 4 (the direction of the arrow A in FIG. 8) so as to form long columnar fin rows 241-1 and 241-2 that extend in the direction of the arrows B (see FIG. 8).

Likewise, the short columnar fins 22 are arranged on the cooling surface 11a at intervals in the direction of the arrows B so as to form short columnar fin rows 242 that extend in the direction of the arrows B (see FIG. 8).

In the third embodiment, row groups 243 that are each made up of two long columnar fin rows 241-1 and 241-2 and row groups that are each made up of a short columnar fin row 242 are arranged alternately in the direction of the arrow A on the cooling surface 11a so that the columnar fins 21-1 and 21-2 and 22 are arranged in the staggered manner.

Therefore, when seen in the direction of the arrow A, each of the long columnar fins 21-2 of each long columnar fin row 241-2 is positioned such that at least a portion of the long columnar fin 21-2 does not overlap any one of the long columnar fins 21-1 of the adjacent long columnar fin row 241-1. As a result, the cooling medium 4 flowing in the vicinity of the opposite surface 11b flows through spaces between the long columnar fins 21-1 of the long columnar fin row 241-1, and then strikes the long columnar fins 21-2 of the next long columnar fin row 241-2. Hence, the flow of the cooling medium 4 in the vicinity of the opposite surface 11b can be impeded equally over the entire width of the flow.

Besides, in the third embodiment, as shown in FIG. 8, each one of recesses 231 formed in the opposite surface 11b embraces distal end portions 21-1a and 21-2a of all the long columnar fins 21-1 and 21-2 of a corresponding one of the row groups 243. That is, each of the distal end portions 21-1a and 21-2a of the long columnar fins 21-1 and 21-2 of one row group 243 is inserted in each of the recesses 231. Hence, since the recesses 231 are thus wide, the tolerable range of the variation in the pitch between the long columnar fin rows 241 is increased, so that the ease of assembly of the heat sink 10 improves.

Fourth Embodiment

In the first to third embodiments, the long columnar fins 21 and the short columnar fins 22 are arranged at intervals in the direction (the direction of the arrows B) orthogonal to the direction of the mainstream of the cooling medium 4 (the direction of the arrow A) so as to form rows of the long columnar fins 21 and rows of the short columnar fins 22, respectively.

In the fourth embodiment, on another hand, the long columnar fins 21 and the short columnar fins 22 are arranged at intervals in a direction (direction of arrows C) that intersects obliquely with the direction of the mainstream of the cooling medium 4 (the direction of the arrow A) so as to form rows of the long columnar fins 21 and rows of the short columnar fins 22 that extend in the direction of the arrows C.

Hereinafter, the configuration of a heat sink in accordance with the fourth embodiment will be described with reference to FIGS. 9 and 10. However, the configuration other than groove portions and the arrangement of columnar fins is substantially the same as the configuration in the first embodiment, and will not be described below.

Figure 9:
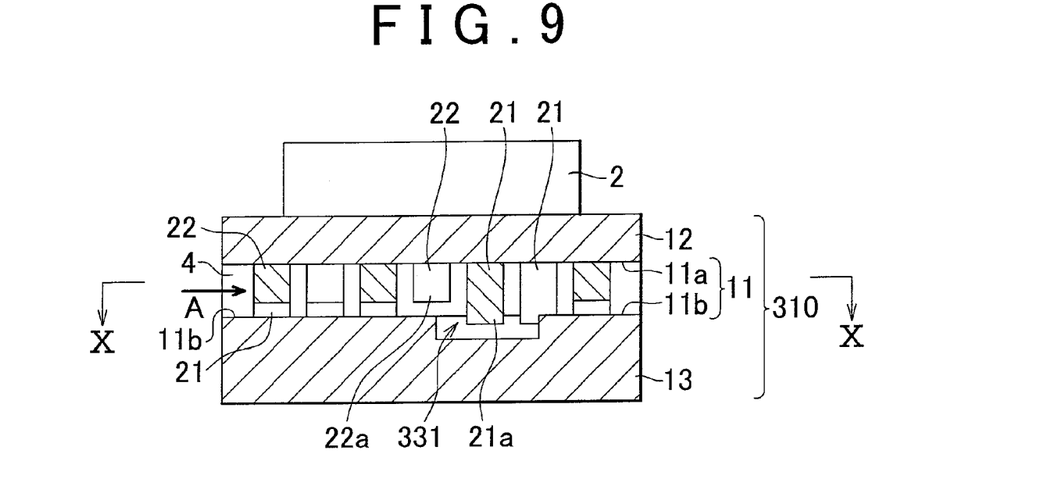
FIG. 9 is a sectional view taken along line IX-IX in FIG. 10, showing a heat sink-equipped electronic component part according to a fourth embodiment of the invention.
Figure 10:
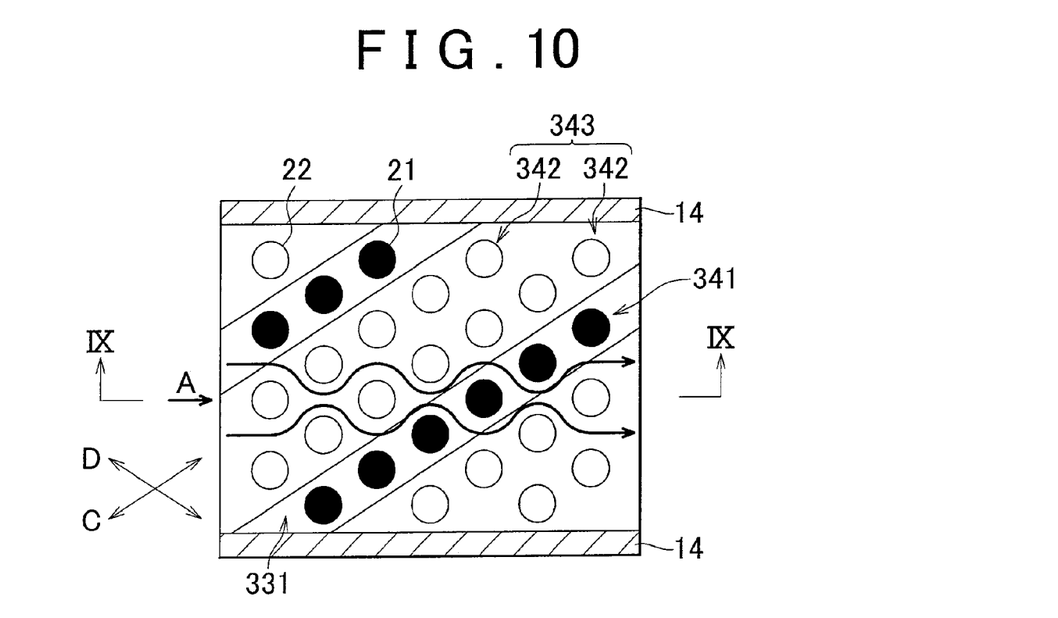
FIG. 10 is a sectional view taken along line X-X in FIG. 9.

FIG. 9 is a sectional view taken along line IX-IX in FIG. 10, showing a heat sink-equipped electronic component part according to the fourth embodiment. FIG. 10 is a sectional view taken along line X-X in FIG. 9.

A heat sink 310 in the fourth embodiment includes the long columnar fins 21 and the short columnar fins 22 as in the first embodiment.

The long columnar fins 21 are arranged on the cooling surface 11a at intervals in the direction (the direction of the arrows C in FIG. 10) that intersects obliquely with the direction of the mainstream of the cooling medium 4 (the direction of the arrow A in FIG. 10) so as to form long columnar fin rows 341 that extend in the direction of the arrows C (see FIG. 10). The long columnar fin rows 341 are arranged at intervals in a direction (direction of arrows D in FIG. 10) that intersects with the direction of the arrows C.

Likewise, the short columnar fins 22 are arranged on the cooling surface 11a at intervals in the direction of the arrows C so as to form short columnar fin rows 342 (see FIG. 10) that extend in the direction of the arrows C. The plurality of short columnar fin rows 342 are arranged at intervals in the direction of the arrows D.

In the fourth embodiment, the long columnar fin rows 341 extend in the direction that intersects obliquely with the direction of the mainstream of the cooling medium 4 (the direction of the arrow A), instead of the direction orthogonal to the direction of the mainstream of the cooling medium 4. Therefore, the clearances between the long columnar fins 21 in each long columnar fin row 341 are relatively small when seen in the direction of the arrow A. For example, when seen in the direction of the arrow A, the long columnar fins 21 in each long columnar fin rows 341 serially overlap each other. Hence, the flow of the cooling medium 4 in the vicinity of the opposite surface 11b can be equally impeded over the entire width of the flow.

The angle between the direction of the arrows C and the direction of the arrows A is set according to the pitch between the long columnar fins 21 and the sectional shape of the long columnar fins 21, and may be, for example, 30° to 60°.

In the fourth embodiment, since the long columnar fin rows 341 extend in the direction of the arrows C, recesses 331 formed in the opposite surface 11b extend in the direction of the arrows C. Each of the recesses 331 embraces the distal end portions 21a of all the long columnar fins 21 of a corresponding one of the long columnar fin rows 341. That is, the distal end portion 21a of each of the long columnar fins 21 of one long columnar fin row 341 is inserted in each of the recesses 331.

While the first to fourth embodiments of the invention have been described above, the invention is not restricted by the foregoing embodiments. It is possible to make various changes and substitutions in the foregoing embodiments without departing from the scope of the invention.

For example, although in the second and third embodiments, the positional relationship between the two long columnar fin rows (the positional relationship between the long columnar fin rows 141-1 and 141-2 in the second embodiment, and the positional relationship between the long columnar fin rows 241-1 and 241-2 in the third embodiment) is defined, this positional relation may also be applied to the case where the columnar fins 21-1 and 21-2 and 22 are not arranged in the staggered manner. Besides, this positional relationship may also be applied to the case where the long columnar fins 21 and the short columnar fins 22 are arranged at intervals in the direction (the direction of the arrows C) that intersects obliquely with the direction of the mainstream of the cooling medium 4 (the direction of the arrow A) so as to form the rows.

What is claimed is:

1. A heat sink that has therein a flow path through which a cooling medium that cools a heat-producing body flows, wherein the flow path has two flow path wall surfaces that face each other, the heat sink comprising:
    a plurality of columnar fins that are provided on one of the flow path wall surfaces, the one of the flow path wall surfaces being positioned at a side where the heat-producing body is provided, the plurality of the columnar fins including long columnar fins and short columnar fins and protruding from the one of the flow path wall surfaces in a protrusion direction perpendicular to the one of the flow path wall surfaces, the long columnar fins being longer than the short columnar fins in the protrusion direction, and the other of the flow path wall surfaces having a recess defining a concave portion in which a distal end portion of the long columnar fin is inserted,
        wherein the long columnar fins, on the one of the flow path wall surfaces, are arranged in rows at intervals in a predetermined direction that intersects obliquely with a direction of a mainstream of the cooling medium, so as to form a columnar fin row, and
        wherein the short columnar fins are arranged in rows, and are between the long columnar fins when viewed from a direction of a mainstream of the cooling medium and
    a plurality of concave portions and convex portions that are provided on the other of the flow path wall surfaces, a row of long columnar fins facing one of the concave portions and a row of short columnar fins facing one of the convex portions.

2. The heat sink according to claim 1, wherein:
    the long columnar fins, on the one of the flow path wall surfaces, are arranged at intervals in a predetermined direction that intersects with a direction of a mainstream of the cooling medium, so as to form a long columnar fin row;
    the recess extends in the predetermined direction on the other of the flow path wall surfaces; and
    the distal end portion of each of the long columnar fins of the long columnar fin row is inserted in the recess.

3. The heat sink according to claim 1, wherein the plurality of the columnar fins are arranged in a staggered manner on the one of the flow path wall surfaces.

4. The heat sink according to claim 1, wherein:
    the long columnar fins, on the one of the flow path wall surfaces, are arranged at intervals in a predetermined direction that intersects with a direction of a mainstream of the cooling medium, so as to form long columnar fin rows; and
    when seen in the direction of the mainstream of the cooling medium, each of the long columnar fins of one of the long columnar fin rows is positioned so that at least a portion of the long columnar fin does not overlap the plurality of the long columnar fins of another of the long columnar fin rows.

5. A heat sink-equipped electronic component part comprising:
    the heat sink according to claim 1; and
    an electronic component that is a heat producing body is provided on the heat sink.

6. The heat sink according to claim 1, wherein the long columnar fins and the short columnar fins are arranged in the predetermined direction that intersects obliquely with the direction of the mainstream of the cooling medium.

7. A heat sink that has therein a flow path through which a cooling medium that cools a heat-producing body flows, wherein the flow path has two flow path wall surfaces that face each other, the heat sink comprising:
    a plurality of columnar fins that are provided on one of the flow path wall surfaces, the one of the flow path wall surfaces being positioned at a side where the heat-producing body is provided, the plurality of the columnar fins including long columnar fins and short columnar fins, wherein the long columnar fins and the short columnar fins are arranged in respective rows and are protruded from the one of the flow path wall surfaces, and the long columnar fins are longer than the short columnar fins in a protrusion direction of the long columnar fins and the short columnar fins, and the other of the flow path wall surfaces has a recess defining a concave portion in which a distal end portion of the long columnar fin is inserted, the protrusion direction being perpendicular to the one of the flow path wall surfaces; and
    a plurality of concave portions and convex portions that are provided on the other of the flow path wall surfaces, a row of long columnar fins facing one of the concave portions and a row of short columnar fins facing one of the convex portions.

8. The heat sink according to claim 7, wherein:
    the long columnar fins and the short columnar fins do not contact the other of the flow path wall surfaces, and a distance between a bottom surface of the recess and the one of the flow path wall surfaces is longer than a distance between a surface, which faces the one of the flow path wall surfaces, of the other of the flow path wall surfaces other than the bottom surface of the recess and the one of the flow path wall surfaces.

9. The heat sink according to claim 7, wherein the plurality of the concave portions has a groove shape and the plurality of convex portions has a ripped shape.

* * * * *